(12) United States Patent
Höppel (10) Patent No.: US 10,361,345 B2
(45) Date of Patent: Jul. 23, 2019

(54) METHOD OF PRODUCING A PLURALITY OF OPTOELECTRONIC SEMICONDUCTOR COMPONENTS AND OPTOELECTRONIC SEMICONDUCTOR COMPONENT

(71) Applicant: OSRAM Opto Semiconductors GmbH, Regensburg (DE)

(72) Inventor: Lutz Höppel, Alteglofsheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/542,150

(22) PCT Filed: Jan. 13, 2016

(86) PCT No.: PCT/EP2016/050579
§ 371 (c)(1),
(2) Date: Jul. 7, 2017

(87) PCT Pub. No.: WO2016/113314
PCT Pub. Date: Jul. 21, 2016

(65) Prior Publication Data
US 2018/0269364 A1    Sep. 20, 2018

(30) Foreign Application Priority Data
Jan. 15, 2015    (DE) .................. 10 2015 100 575

(51) Int. Cl.
*H01L 33/00*    (2010.01)
*H01L 33/54*    (2010.01)
(Continued)

(52) U.S. Cl.
CPC .......... *H01L 33/54* (2013.01); *H01L 33/0095* (2013.01); *H01L 33/486* (2013.01);
(Continued)

(58) Field of Classification Search
None
See application file for complete search history.

(56) References Cited

U.S. PATENT DOCUMENTS

2004/0262716 A1    12/2004 Aoki
2006/0057751 A1    3/2006 Shen
(Continued)

FOREIGN PATENT DOCUMENTS

CN    101278415 A    10/2008
CN    102723410 A    10/2012
(Continued)

OTHER PUBLICATIONS

First Office Action dated Sep. 3, 2018, of counterpart Chinese Application No. 201680005873.9, along with an English translation.
(Continued)

*Primary Examiner* — Calvin Y Choi
(74) *Attorney, Agent, or Firm* — DLA Piper LLP (US)

(57) ABSTRACT

A method of producing a plurality of optoelectronic semiconductor components includes a) preparing a composite with a semiconductor layer sequence, wherein the composite includes a plurality of component areas mechanically connected to one another; b) forming a plurality of connecting surfaces on the semiconductor layer sequence, wherein at least one connecting surface is formed on each component area; c) forming a molding compound on the semiconductor layer sequence, wherein the molding compound fills interstices between the connecting surfaces; and d) singulating the composite with the molding compound, wherein during singulation a plurality of molded bodies is formed from the molding compound, each of which is associated with a semiconductor body obtained from a component area of the composite.

18 Claims, 4 Drawing Sheets

(51) Int. Cl.
  *H01L 33/52* (2010.01)
  *H01L 33/48* (2010.01)
  *H01L 33/58* (2010.01)
  *H01L 25/16* (2006.01)

(52) U.S. Cl.
  CPC .............. *H01L 33/52* (2013.01); *H01L 33/58* (2013.01); *H01L 25/167* (2013.01); *H01L 33/0079* (2013.01); *H01L 2924/0002* (2013.01); *H01L 2933/005* (2013.01)

(56) References Cited

U.S. PATENT DOCUMENTS

| | | |
|---|---|---|
| 2009/0004778 A1 | 1/2009 | Lee et al. |
| 2009/0230538 A1 | 9/2009 | Wang et al. |
| 2009/0316315 A1 | 12/2009 | Wang et al. |
| 2010/0276706 A1* | 11/2010 | Herrmann ........... H01L 33/0079 257/89 |
| 2012/0248485 A1 | 10/2012 | Shinbori et al. |
| 2012/0261681 A1 | 10/2012 | Ooyabu et al. |
| 2013/0146933 A1* | 6/2013 | Unosawa ................ H01L 33/38 257/99 |
| 2013/0240934 A1 | 9/2013 | Park et al. |
| 2013/0248910 A1 | 9/2013 | Kimura et al. |
| 2014/0377894 A1 | 12/2014 | Kwon et al. |
| 2018/0269364 A1 | 9/2018 | Höppel |

FOREIGN PATENT DOCUMENTS

| | | |
|---|---|---|
| CN | 102738323 A | 10/2012 |
| CN | 103325933 A | 9/2013 |
| DE | 10 2012 218 457 A1 | 4/2014 |
| EP | 2 506 322 A2 | 10/2012 |
| JP | 2010-177225 A | 8/2010 |
| JP | 2012222320 A | 11/2012 |
| JP | 2013201273 A | 10/2013 |
| JP | 2018-508984 A | 3/2018 |
| WO | 2006035664 A1 | 4/2006 |

OTHER PUBLICATIONS

Japanese Office Action dated Aug. 20, 2018, of counterpart Japanese Application No. 2017-537370, along with an English translation.
Decision of Refusal dated Apr. 1, 2019, of counterpart Japanese Application No. 2017-537370, along with an English translation.
Second Office Action dated Mar. 21, 2019, of counterpart Chinese Application No. 201680905873.9, along with an English translation.

* cited by examiner

METHOD OF PRODUCING A PLURALITY OF OPTOELECTRONIC SEMICONDUCTOR COMPONENTS AND OPTOELECTRONIC SEMICONDUCTOR COMPONENT

TECHNICAL FIELD

This disclosure relates to a method of producing optoelectronic semiconductor components and an optoelectronic semiconductor component.

BACKGROUND

With optoelectronic semiconductor components, e.g. LEDs, various production steps are often employed depending on the size of the semiconductor components to be produced, in particular to form the package. This increases the overall complexity of the production method and the associated costs.

It could therefore be helpful to provide a method that can be carried out simply and reliably, largely independently of the size of the semiconductor components to be produced. Furthermore, it could be helpful to provide a semiconductor component that is distinguished by good optoelectronic properties and at the same time is simple to produce.

SUMMARY

I provide a method of producing a plurality of optoelectronic semiconductor components including a) preparing a composite with a semiconductor layer sequence, wherein the composite includes a plurality of component areas mechanically connected to one another; b) forming a plurality of connecting surfaces on the semiconductor layer sequence, wherein at least one connecting surface is formed on each component area; c) forming a molding compound on the semiconductor layer sequence, wherein the molding compound fills interstices between the connecting surfaces; and d) singulating the composite with the molding compound, wherein during singulation a plurality of molded bodies is formed from the molding compound, each of which is associated with a semiconductor body obtained from a component area of the composite.

I also provide an optoelectronic semiconductor component including a semiconductor body that generates and/or receives radiation; a radiation passage surface; at least one connecting surface arranged on a side of the semiconductor body facing away from the radiation passage surface; a molded body arranged on the side of the semiconductor body facing away from the radiation passage surface and borders the semiconductor body and the connecting surface; and a further molded body that forms a lateral surface of the semiconductor component delimiting the semiconductor component in a lateral direction running parallel to the radiation passage surface and borders the molded body and the semiconductor body in some areas.

I further provide a method of producing a plurality of optoelectronic semiconductor components including a) preparing a composite with a semiconductor layer sequence, wherein the composite includes a plurality of component areas mechanically connected to one another; b) forming a plurality of connecting surfaces on the semiconductor layer sequence, wherein at least one connecting surface is formed on each component area; c) forming a molding compound on the semiconductor layer sequence, wherein the molding compound fills interstices between the connecting surfaces; d) singulating the composite with the molding compound, wherein, during singulation, a plurality of molded bodies is formed from the molding compound, each of which is associated with a semiconductor body obtained from a component area of the composite; e) overmolding the semiconductor bodies and the molded bodies with a further molding compound after d) to form a further composite, wherein the further molding compound is formed such that the connecting surfaces are completely covered; f) exposing the connecting surfaces; and g) severing the further composite.

DETAILED DESCRIPTION

I provide a method of producing a plurality of optoelectronic semiconductor components.

A composite with a semiconductor layer sequence may be prepared, wherein the composite comprises a plurality of component areas mechanically connected to one another. For example, the semiconductor layer sequence is intended to generate and/or receive electromagnetic radiation, e.g. in the visible, infrared or ultraviolet range of the spectrum.

The composite comprises, e.g. a carrier on which the semiconductor layer sequence is arranged. The carrier can be a growth substrate for deposition, in particular the epitaxial deposition, of the semiconductor layer sequence. Alternatively, the carrier can also be different from the growth substrate for the semiconductor layer sequence.

The semiconductor layer sequence can be patterned in a lateral direction, i.e. along a main extension plane of the semiconductor layers of the semiconductor layer sequence, e.g. for the subsequent electrical bonding of one or more semiconductor layers of the semiconductor layer sequence.

The semiconductor layer sequence can furthermore extend continuously over the plurality of component areas. Alternatively, the semiconductor layer sequence can be patterned to define the individual component areas, in which case the semiconductor layer sequence can be partially or completely severed in a vertical direction, i.e. perpendicular to the main extension plane of the semiconductor layers of the semiconductor layer sequence. In particular, the individual component areas may mechanically connect to one another via the carrier only.

The method may comprise a step in which a plurality of connecting surfaces are formed on the semiconductor layer sequence. In particular, at least one connecting surface is formed on each component area. Preferably, two connecting surfaces are formed on each component area, each of which electrically bonds semiconductor layers of the semiconductor layer sequence that differ from one another. For example, each component area has precisely two or more than two connecting surfaces arranged on the side of the semiconductor layer sequence facing away from the carrier.

The method may comprise a step in which a molding compound is formed on the semiconductor layer sequence. In particular, the molding compound is formed such that it fills the interstices between the connecting surfaces completely or at least partially. The vertical extension of the applied molding compound can be large compared to the vertical extension of the semiconductor layer sequence. For example, the vertical extension of the applied molding compound is at least twice as large as the vertical extension of the semiconductor layer sequence. A mechanical stabilizing of the semiconductor layer sequence by the molding compound is facilitated in this way.

In particular, the molding compound borders the connecting surfaces directly. For example, the molding compound covers the connecting surfaces completely or at least in some areas on the side facing away from the semiconductor layer sequence.

The method may comprise a step in which the composite with the molding compound is singulated, wherein a plurality of molded bodies are formed from the molding compound during singulation, each of which is associated with a semiconductor body originating from a component area of the composite.

The molded bodies are thus obtained when the composite is singulated, and so the lateral surfaces that delimit the molded body in a lateral direction can exhibit traces characteristic of the singulation method, e.g. traces of mechanical material erosion such as grinding traces or sawing traces, or traces of material erosion by coherent radiation, e.g. laser radiation.

At the time when the composite is singulated, therefore, the molding compound has already been applied on to the semiconductor layer sequence. The molded bodies formed by the singulation can form package bodies for the semiconductor bodies or partial areas of package bodies. In particular, the molding compound can be applied before the semiconductor layer sequence is divided into individual semiconductor bodies.

A composite with a semiconductor layer sequence may be prepared, wherein the composite has a plurality of component areas mechanically connected to one another. A plurality of connecting surfaces are formed on the semiconductor layer sequence, wherein at least one connecting surface is formed on each component area. On the semiconductor layer sequence a molding compound is formed, wherein the molding compound fills the interstices between the connecting surfaces. The composite with the molding compound is singulated, wherein a plurality of molded bodies are formed from the molding compound during singulation, each of which is associated with a semiconductor body originating from a component area of the composite.

The lateral extension of the molded bodies is therefore established when the composite is singulated and can thus be adjusted simply and reliably to the size of the component areas of the composite. In particular, the semiconductor layer sequence can extend continuously over the component areas when the composite is singulated. During singulation, therefore, no high-precision adjustment of the singulation tracks relative to pre-defined semiconductor bodies is necessary. In other words, formation of the semiconductor bodies from the semiconductor layer sequence and singulation of the composite with the molding compound can take place in a joint production step.

The method may comprise a step in which a growth substrate for the semiconductor layer sequence is removed. In particular, the growth substrate is removed after the molding compound has been formed on the semiconductor layer sequence. The molding compound therefore stabilizes the semiconductor layer sequence mechanically and the growth substrate is no longer needed for this purpose. Alternatively, it is possible for the growth substrate to remain on the semiconductor layer sequence. In particular, the growth substrate can be removed before the composite is singulated. The growth substrate itself does not therefore have to be severed during singulation and can be used again as a growth substrate, e.g. in a subsequent production cycle.

The method may comprise a step in which the semiconductor bodies and the molded bodies are overmolded with a further molding compound to form a further composite after the singulation of the composite. The molded bodies that have been separated from one another after singulation are therefore held together with the further molding compound and thus form the further composite. In particular, when the further composite is formed, the interstices between the molded bodies can be filled in some areas or completely.

Between singulation of the composite and formation of the further composite a center-to-center distance between adjacent semiconductor bodies may be increased. The center-to-center distance is therefore not, or at least not exclusively, predefined by the distance between the component areas of the composite. The production of semiconductor components having a lateral extension greater, e.g. at least 10% greater or at least 50% greater, than the lateral extension of the semiconductor body along the same direction is thus facilitated.

The further molding compound may be severed to form the semiconductor components from the further composite. The individual optoelectronic semiconductor components are therefore obtained as a result of severing the further molding compound. The further molded bodies of the semiconductor components obtained upon severing each form the lateral surfaces delimiting the semiconductor component in a lateral direction. These lateral surfaces can exhibit traces characteristic of the severing method, e.g. traces of mechanical material erosion or traces of material erosion by coherent radiation. For example, the further molded body surrounds the molded body along the entire perimeter in a lateral direction. In other words, the molded body does not border the lateral surface of the semiconductor component at any point.

The connecting surfaces may be covered, in particular completely covered, at times during the production method. For example, the connecting surfaces can be covered by the molding compound and/or the further molding compound.

The further molding compound may be formed such that the connecting surfaces are completely covered, wherein the connecting surfaces are exposed in a further step before the further composite is severed. For example, the exposure can take place by mechanical material erosion of the further molding compound and/or the molding compound, in particular over the entire surface. In particular, to expose the connecting surfaces, both the molding compound and the further molding compound can be eroded in some areas. For example, the molding compound and the further molding compound are eroded at the same time in some areas.

The molding compound may be formed such that the connecting surfaces are completely covered, wherein the connecting surfaces are exposed before the further molding compound is applied. At the time when the further molding compound is applied, the connecting surfaces are therefore already accessible on the side of the molding compound facing away from the semiconductor layer sequence.

Contacts may be formed on the further composite, each of which electrically bonds to one of the connecting surfaces.

The contacts are intended in particular for the external electrical bonding of the optoelectronic semiconductor components. Expediently, each semiconductor component has precisely two or more than two contacts. In particular, all contacts of the semiconductor components can be arranged on the same side of the semiconductor component.

The molding compound and/or the further molding compound may be applied by a molding method. A molding method is generally understood to be a method by which a molding compound can be formed according to a predefined shape and hardened if necessary. In particular, the term "molding method" comprises molding, film assisted molding, injection molding, transfer molding and compression molding. By a molding method, even large vertical extensions, e.g. a vertical extension at least twice as great as the vertical extension of the semiconductor layer sequence, can be achieved simply and inexpensively, in particular compared with a deposition method such as a CVD method or a PVD method.

The composite may be singulated by coherent radiation, in particular laser radiation. It has been shown that during singulation of this type the mechanical load at an interface of the molding compound facing towards the semiconductor layer sequence is reduced, in particular compared to a mechanical singulation method. As a result, the risk of detachment of the molding compound from the semiconductor layer sequence can be reduced.

Furthermore, an optoelectronic semiconductor component is provided.

The semiconductor component may comprise a semiconductor body intended to generate and/or receive radiation, a radiation passage surface and at least one connecting surface, wherein the connecting surface is arranged on the side of the semiconductor body facing away from the radiation passage surface.

The semiconductor component may comprise a molded body arranged on the side of the semiconductor body facing away from the radiation passage surface. In particular, the molded body borders the semiconductor body and the connecting surface. The lateral surfaces of the semiconductor body are in particular free from material of the molded body.

The semiconductor component may have a further molded body forming a lateral surface of the semiconductor component delimiting the semiconductor component in a lateral direction running parallel to the radiation exit surface. In particular, the further molded body borders the molded body and the semiconductor body in some areas.

The semiconductor component may comprise a semiconductor body intended to generate and/or receive radiation, a radiation passage surface and at least one connecting surface, wherein the connecting surface is arranged on the side of the semiconductor body facing away from the radiation passage surface. The semiconductor component furthermore comprises a molded body arranged on the side of the semiconductor body facing away from the radiation passage surface and borders the semiconductor body and the connecting surface. The semiconductor component furthermore comprises a further molded body forming a lateral surface of the semiconductor component delimiting the semiconductor component in a lateral direction running parallel to the radiation passage surface and borders the molded body and the semiconductor body in some areas.

The molded body and the further molded body can form a package body for the semiconductor body. In particular, the optoelectronic semiconductor component can be in the form of a surface mounted device (smd).

An extension of the molded body may be no more than 20 μm greater than an extension of the semiconductor body, at least along a lateral direction. In particular, the extension of the molded body along this lateral direction can also be less than or equal to the extension of the semiconductor body. In particular, the lateral extension of the molded body on at least two lateral surfaces of the semiconductor body or along the entire perimeter of the semiconductor body can be no more than 20 μm greater than an extension of the semiconductor body.

In particular, the molded body and the semiconductor body can be flush with one another at least in a lateral direction. The term "flush" also includes deviations associated with manufacture that can be caused, e.g. by differences in the degree of material erosion during the singulating process. For example, material erosion during singulation by coherent radiation can be greater in a lateral direction for the molding compound than for the semiconductor layer sequence or vice versa. In particular, the molded body and the semiconductor body can be flush with one another on at least two lateral surfaces of the semiconductor body or along the entire perimeter of the semiconductor body.

A semiconductor component of this type can be readily produced by a method in which a molding compound for the molded body is applied before singulation into semiconductor bodies takes place.

The molded body and/or the further molded body may be impervious to the radiation generated or to be received in the semiconductor body during operation. In particular, the molded body and the further molded body can be radiopaque. Furthermore, the molded body and the further molded body can also differ from one another in terms of material.

The semiconductor component may have a contact on a reverse side of the further molded body facing away from the radiation passage surface, which contact electrically bonds to the connecting surface, wherein the contact overlaps the molded body and the further molded body in a top view of the semiconductor component. In a top view of the semiconductor component, the contact can therefore project beyond the semiconductor body in a lateral direction at least in some areas.

An electronic component may be embedded into the further molded body. In particular, the further molded body may directly border the electronic component in some areas. For example, the electronic component can be in the form of an ESD protection element that protects the semiconductor body from electrostatic discharge (ESD). For example, the electronic component is an ESD protection diode.

The semiconductor component can therefore have an ESD protection or other electronic functionality integrated into the semiconductor component. For example, the electronic component electrically connects in parallel to the semiconductor body by the contact.

The method described above is particularly suitable for producing the semiconductor component. Features mentioned in relation to the semiconductor component can therefore also be referred to for the method and vice versa.

Further configurations can be taken from the following description of the examples in conjunction with the figures.

Identical or similar elements or elements having the same effect are provided with the same reference numbers in the figures.

The figures are all schematic diagrams and are therefore not necessarily to scale. Rather, to make them clearer, relatively small elements and in particular layer thicknesses may be shown with their size exaggerated.

In FIGS. 1A to 1G, an example of a method of producing optoelectronic semiconductor components is shown, wherein the description is based on a section from which two optoelectronic semiconductor components are obtained during production. Using the method described, a plurality of semiconductor components can be produced at the same time.

Figure 1A:
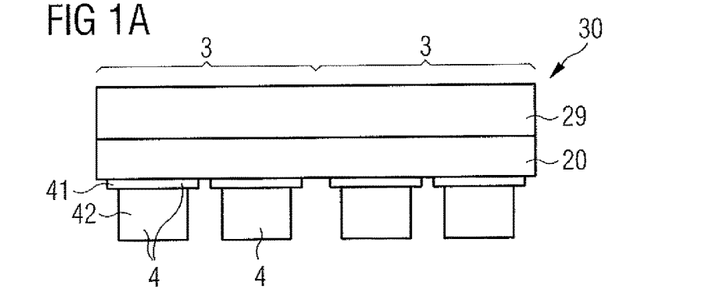
FIGS. 1A to 1G show an example of a method of producing optoelectronic semiconductor components with the aid of intermediate steps each illustrated in a schematic sectional view.

As shown in FIG. 1A, a composite 30 is prepared. The composite 30 has a semiconductor layer sequence 20. The semiconductor layer sequence 20 is arranged on a carrier, which in this example is formed by a growth substrate 29. The section shown in FIG. 1A has two component areas 3 mechanically connected to one another. The semiconductor layer sequence 20 can extend continuously over the areas 3 as illustrated in FIG. 1A. Deviating from this, however, the semiconductor layer sequence can also be patterned laterally to define the component areas 3.

On the side of the semiconductor layer sequence 20 facing away from the growth substrate 29, a plurality of connecting surfaces 4 are arranged. The connecting surfaces each have a connecting layer 41 and a further connecting layer 42. The connecting layer 41 is formed in a patterned shape, e.g. by a photolithographic patterning process. The further connecting layer 42 can be formed on the connecting layer 41 by a galvanic deposition process, for example, for reinforcement at least in some areas.

The component areas 3 each have two connecting surfaces 4. However, a component area 3 can also comprise only one connecting surface or more than two connecting surfaces. The semiconductor layer sequence 20 can be patterned for the electrical bonding of semiconductor layers of the semiconductor layer sequence 20 that are different from one another so that when an electrical voltage is applied between two connecting surfaces of a component area 3 during subsequent operation, charge carriers are injected from opposite sides into an active area of the semiconductor layer sequence intended to generate radiation and recombine there, emitting radiation. To simplify the illustration, patterning of the semiconductor layer sequence 20 and the layer construction of the semiconductor layer sequence are not shown explicitly in the figures.

Figure 1B:
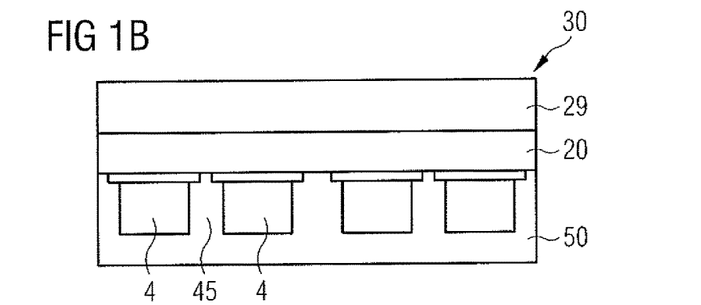

Next, as illustrated in FIG. 1B, a molding compound 50 is formed on the semiconductor layer sequence 20. The molding compound 50 completely covers the connecting surfaces 4 on the side facing away from the semiconductor layer sequence 20. The molding compound 50 is formed on the side of the semiconductor layer sequence 20 facing away from the growth substrate 29.

The molding compound 50 can be applied, e.g. by a molding method. The molding compound 50 fills the interstices 45 between adjacent connecting surfaces 4 in particular and directly borders the connecting surfaces 4 at least in some areas.

After the molding compound 50 has been applied, it can mechanically stabilize the semiconductor layer sequence 20 so that the growth substrate 29 can be removed. This can take place, e.g. by a laser lift-off method or a mechanical or chemical method. At the time when the growth substrate is removed, the molding compound, which later forms part of a package of the semiconductor component, can therefore already have been applied on to the semiconductor layer sequence.

Figure 1C:
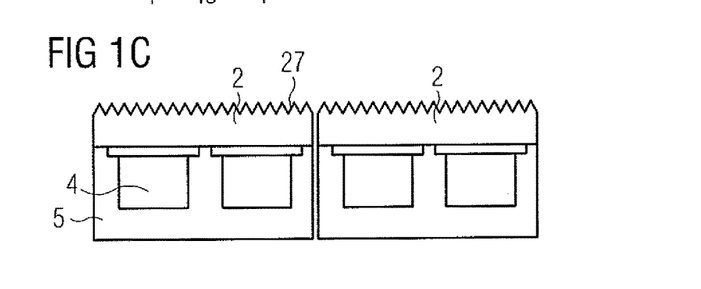

After removal of the growth substrate, the composite can be singulated as shown in FIG. 1C, wherein during singulation the semiconductor layer sequence 20 and the molding compound 50 are severed, as a result of which individual semiconductor bodies 2 and molded bodies 5 are obtained.

Preferably, the semiconductor layer sequence 20 extends continuously over the component areas 3 immediately before the composite is singulated so that the semiconductor bodies 2 are only obtained upon singulation. A high-precision adjustment of the singulation tracks relative to semiconductor bodies already pre-defined before singulation is therefore unnecessary.

Singulation preferably takes place by coherent radiation, e.g. by laser radiation. It has been shown that coherent radiation is particularly suitable for singulation since it results in a reduction in the mechanical load occurring when the composite is singulated compared with a mechanical singulation method. Thus, the risk of delamination of the molding compound from the semiconductor layer sequence during singulation can be reduced. Alternatively, however, a mechanical singulation method can also be used.

The semiconductor layer sequence 20 and the molding compound 50 are severed when the composite 30 is singulated, in particular in a joint production step. As a result, the semiconductor bodies 2 obtained and the associated molded bodies 5 are flush with one another. Depending on the singulation method, the molded bodies can also be smaller or larger in their lateral extension than the associated molded bodies. For example, during singulation by coherent radiation, e.g. in a laser separation method, the molding compound can be eroded to a greater degree in a lateral direction than the material of the semiconductor layer sequence. As a result, the lateral extension of the molded body can be smaller than the lateral extension of the associated semiconductor body, in particular along the entire perimeter of the semiconductor body. Alternatively, the molding compound can be eroded to a lesser extent in a lateral direction than the material of the semiconductor layer sequence. In this case, the molding compound can project beyond the semiconductor body in a lateral direction in some areas or along the entire perimeter, usefully however by no more than 20 µm.

During singulation by a mechanical method, the molded bodies 5 and the associated semiconductor bodies 2 can also be exactly or almost exactly flush with one another, e.g. with a deviation of no more than 2 µm.

A semiconductor body 2 is associated with each molded body 5. On the side of the semiconductor layer sequence facing away from the molding compound 50, as shown in FIG. 1C, a patterning 27 can optionally be formed for improved in-coupling or out-coupling of radiation.

During singulation of the composite 30 into semiconductor bodies, the molding compound 50, that forms a part of the package in the finished semiconductor component, has therefore already been applied on to the semiconductor layer sequence 20. In particular, therefore, the molding compound can already provide mechanical stability when the composite is singulated into semiconductor bodies. Reliability of the production method can thus be increased. In particular(apart from changes in length due to thermal expansion caused by different temperatures for performing the individual production steps) any two partial areas of the semiconductor layer sequence 20 are located at the same distance from one another during singulation of the composite as during epitaxial deposition.

Figure 1D:
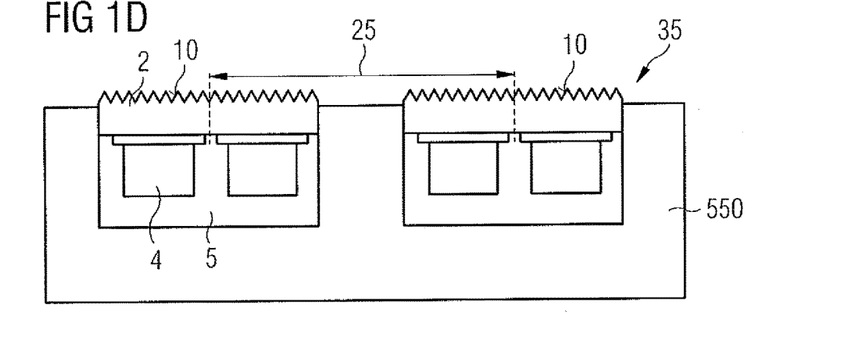

The semiconductor bodies 2 with associated molded body 5 that have been singulated in this way are overmolded with a further molding compound 550 to form a further composite 35 (FIG. 1D). A radiation passage surface 10 of the semiconductor bodies 2 remains free from the further molding compound 550. Before the further molding compound 550 is formed, a center-to-center distance 25 between adjacent semiconductor bodies 2 can be increased by an expansion factor. The expansion factor can be selected within broad limits. The greater the expansion factor is, the greater are the subsequently produced semiconductor components in their lateral extension in relation to the lateral extension of the semiconductor bodies 2. For example, the expansion factor is 1.1 to 5. To increase the center-to-center distance, the molded bodies 5 can be arranged, e.g. on an expandable auxiliary carrier, which is expanded before applying the further molding compound (not shown to simplify the illustration).

The further molding compound 550 fills in particular the interstices between adjacent molded bodies 5. Furthermore, the further molding compound can be molded on to the semiconductor bodies 2, in particular on to the lateral surfaces of the semiconductor bodies.

The further molding compound 550 is applied such that it covers the molded bodies 5 on the side of the molded bodies 5 facing away from the semiconductor bodies 2. The side of the semiconductor bodies 2 facing away from the molded bodies remains free from the further molding compound.

Figure 1E:
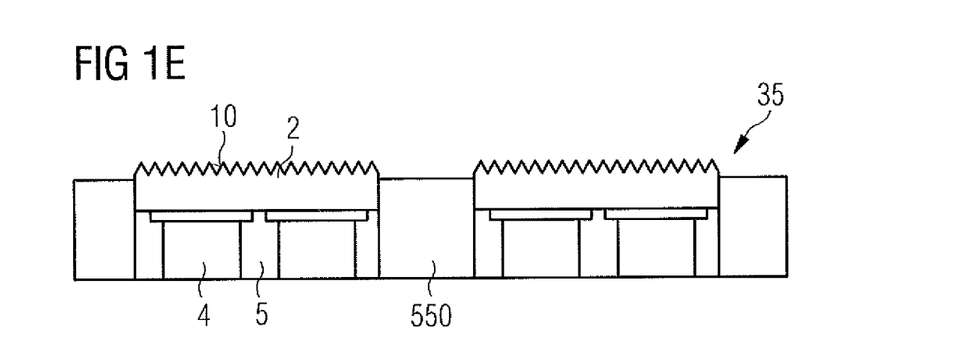

Next, as shown in FIG. 1E, the sides of the connecting surfaces 4 facing away from the semiconductor bodies 2 are exposed by removing the further molding compound 550 and the molding compound 50 in some areas.

In the method step illustrated in FIG. 1E, a simultaneous material erosion of the molding compound of the molded bodies 5 and of the further molding compound 550 takes place.

Deviating from this, however, the connecting surfaces 4 can also be freed from the molding compound 50 before the further molding compound 550 is applied. In a further step, if necessary, only the further molding compound may be removed to free the connecting surfaces that have been freed from the molding compound 50 from the further molding compound.

Exposure of the connecting surfaces 4 preferably takes place by material erosion over the entire surface, e.g. by a mechanical method, for instance by grinding.

Figure 1F:
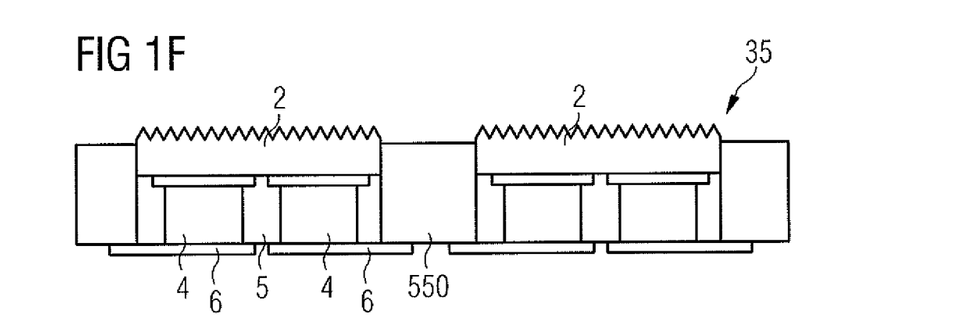

Next, as shown in FIG. 1F, contacts 6 are formed on the further composite 35, each of which is electrically bonded to one of the connecting surfaces 4. In the example shown, the contacts 6 are arranged symmetrically to the semiconductor bodies 2. However, an asymmetrical arrangement of the contacts relative to the semiconductor bodies 2 is also possible.

Figure 1G:
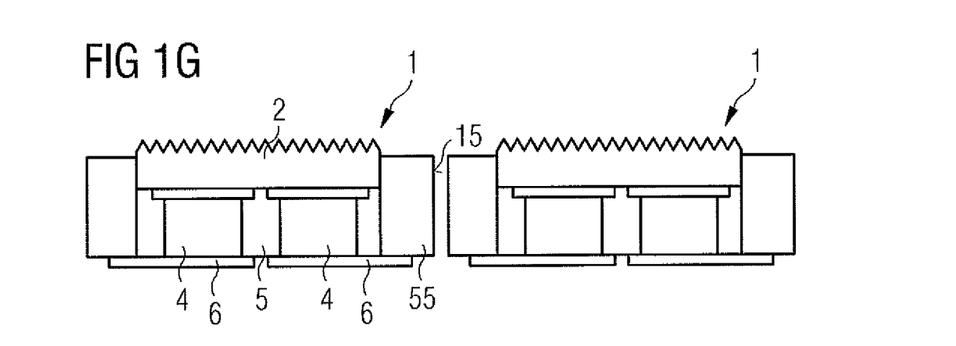

In the step illustrated in FIG. 1G, the further composite 35 is singulated into the semiconductor components 1. The further molding compound 550 is completely severed in a vertical direction here so that each semiconductor component 1 has a further molded body 55 obtained from the further molding compound 550. The surfaces obtained upon severing form the lateral surfaces 15 of the singulated semiconductor components. The lateral surfaces 15 can therefore exhibit traces characteristic of the severing method, e.g. sawing traces or grinding traces or traces of material erosion by coherent radiation.

Before severing the further composite 35, an optical element or a plurality of optical elements can also be applied on to each of the semiconductor components 1. For example, the optical element can be intended to shape the spatial and/or spectral emission characteristics. For example, the optical element is intended for the complete or partial radiation conversion of the radiation generated in the semiconductor body 2. In particular, when applied on to the further composite 35, the optical elements can be present in a lens composite from which the optical elements are obtained when the further composite is severed. Severing the lens composite and the further molding compound can take place in particular in a joint step. In this case, each optical element can be flush with its associated further molded body 550 in a lateral direction, at least in some areas.

Figure 2A:
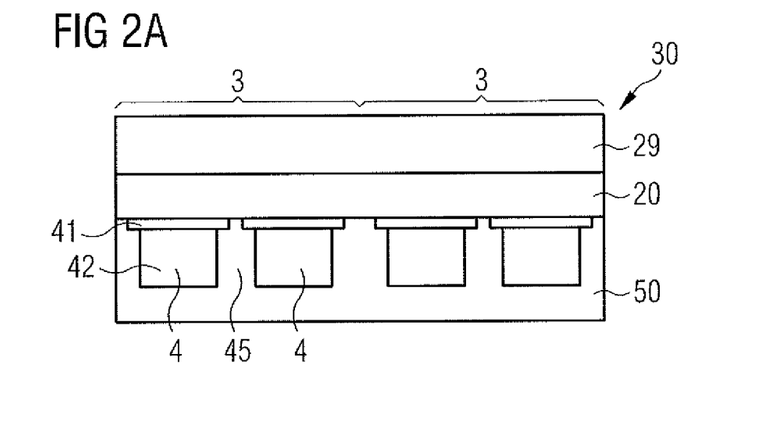
FIGS. 2A to 2C show a further example of a method of producing optoelectronic semiconductor components with the aid of intermediate steps each illustrated in a schematic sectional view.
Figure 2B:
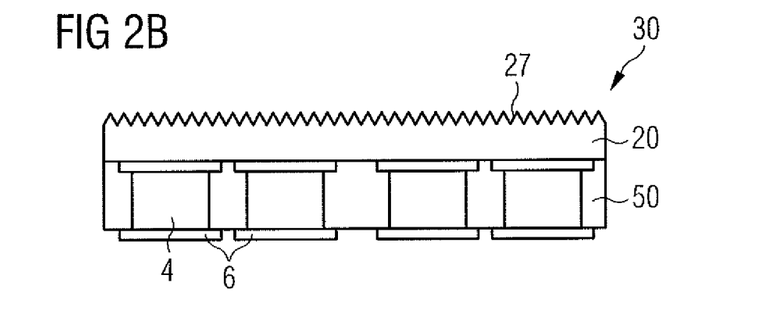
Figure 2C:
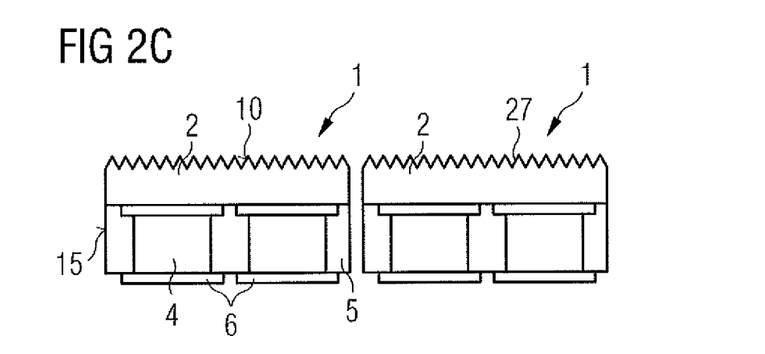

In FIGS. 2A to 2C, a further example of a method of producing optoelectronic semiconductor components is shown. The intermediate step illustrated in FIG. 2A corresponds here to the stage of the preceding example described with the aid of FIG. 1B. In contrast to the example described above, the molding compound 50 is thinned and the contacts 6 are applied before singulation of the composite 30 takes place. This is illustrated in FIG. 2B. Singulation of the composite into a plurality of semiconductor components 1 only takes place afterwards (FIG. 2C). In this example, therefore, the center-to-center distance of the semiconductor bodies 2 of the semiconductor components 1 obtained during singulation corresponds to the distance already displayed by these semiconductor bodies during the epitaxial deposition of the semiconductor layer sequence 20. No expansion therefore takes place, which corresponds to an expansion factor of 1. The lateral extension of the semiconductor components produced in this way is therefore equal to or at best slightly greater than the extension of the semiconductor bodies along the same lateral direction. These semiconductor components with packaged semiconductor bodies wherein the semiconductor components are substantially the same size as the semiconductor bodies are also known as CSP (chip size package) components.

Using the method described, a universal process chain is obtained which uses substantially the same characteristic process steps regardless of the lateral extension of the resulting semiconductor components relative to the lateral extension of the semiconductor bodies. In particular, the center-to-center distance between adjacent semiconductor bodies during production may or may not be increased by an expansion factor. For example, by the further molding compound semiconductor components can also be produced that have a significantly larger lateral dimension than the semiconductor bodies.

Furthermore, in the method described, the semiconductor bodies 2 already provided with the molding compound 50 can be subjected to a binning process, in particular before the further composite 35 is formed. In this way, for example, it can be ensured that all semiconductor bodies 2 in the further composite 35 correspond to pre-defined spectral emission characteristics.

Figure 3A:
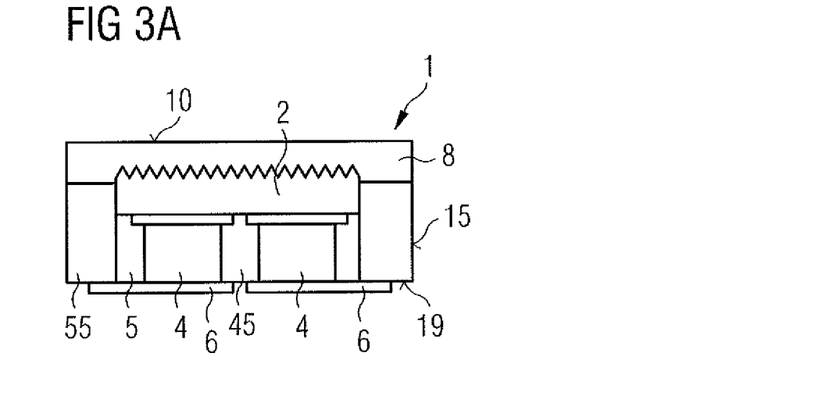
FIGS. 3A and 3B each show an example of an optoelectronic semiconductor component in a schematic sectional view (FIG. 3A) and in a schematic perspective view (FIG. 3B).

An example of an optoelectronic semiconductor component is shown in FIG. 3A. The optoelectronic semiconductor component 1 has a semiconductor body 2 intended to generate and/or receive radiation and a radiation passage surface 10. The semiconductor component has two contacts 6 on the reverse side 19 facing away from the radiation passage surface 10, each of which is electrically bonded to a connecting surface 4. On the side of the semiconductor body facing away from the radiation passage surface, furthermore, a molded body 5 is arranged which borders the semiconductor body 2 and the connecting surfaces 4. The semiconductor component furthermore has a further molded body 55 that forms a lateral surface 15 of the semiconductor component delimiting the semiconductor component in a lateral direction. The further molded body borders the molded body 5 and the semiconductor body 2 in some areas. In particular, the further molded body 55 surrounds the molded body 5 along the entire perimeter of the semiconductor component 1. In a lateral direction, the molded body 5 therefore does not project out at the lateral surface of the semiconductor component 1 at any point.

The semiconductor component 1 is in the form of a surface-mounted semiconductor component with two contacts 6 on the reverse side 19. However, the semiconductor component 1 may also have only one contact or more than two contacts on the reverse side.

The semiconductor component 1 furthermore comprises an optical element 8. For example, the optical element, possibly in the form of a lens, shapes the radiation. Alternatively or in addition, the optical element can serve to convert the radiation to be generated and/or received in the semiconductor body 2.

In particular, the optical element 8 and the further molded body 55 can be flush with one another in a lateral direction. Production of the optoelectronic semiconductor component 1 is thereby facilitated.

A beam path between the semiconductor body 2 and the radiation passage surface 10 of the semiconductor component 1 is free from material of the molded body 5 and the further molded body 55. The molded body 5 and the further molded body 55 can therefore be impervious to the radiation generated or to be received in the semiconductor body during operation. For example, the molded body and/or the further molded body can be formed to reflect the radiation, e.g. with a reflectivity of at least 60%. For example, the molded body and/or the further molded body contain particles that increase reflectivity such as white pigments.

The molded body 5 and the semiconductor body 2 are flush with one another in a lateral direction, in particular along the entire perimeter of the semiconductor body 2. The molded body 5 can also be smaller than the semiconductor body 2, however, or can project beyond the semiconductor body slightly, e.g. by no more than 20 μm.

In a top view of the semiconductor component 1, the contacts 6 overlap the molded body 5 and the further molded body 55. The contacts 6 can in particular protrude beyond the semiconductor body 2 in a lateral direction.

The external electrical bonding of the semiconductor component 1 takes place from the reverse side 19 by the contacts 6 bonded to the semiconductor body 2 via the connecting surfaces 4. For the electrical bonding of the semiconductor body 2, therefore, no shading elements are needed on the radiation passage surface 10. In a semiconductor component 1 in the form of a surface emitter, such shading elements can lead to impaired emission. Furthermore, no wire bonded connection is needed for the electrical bonding of the semiconductor body 2 to the contacts 6 of the semiconductor component. Thus, there is no loss of active surface area of the semiconductor body 2 for forming a bond pad.

Figure 3B:
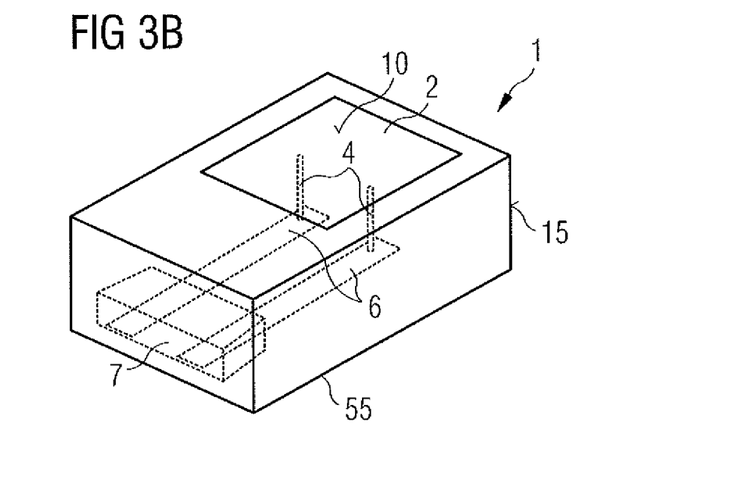

FIG. 3B shows a further example of a semiconductor component 1 in perspective view. This further example can substantially correspond to the example described in connection with FIG. 3A.

In contrast thereto, the semiconductor component 1 comprises an electronic component 7 embedded in the further molded body 55. For example, the electronic component 7 is in the form of an ESD protection element connected in parallel to the semiconductor body 2 via the contacts 6. No additional production step is therefore needed for interconnection of the electronic component and the semiconductor body.

As shown in FIG. 3B, semiconductor components 1 in which the semiconductor body 2 is not arranged centrally in the semiconductor component 1 in relation to the lateral direction can also be produced in a simple and reliable way by the method described.

This application claims priority of DE 10 2015 100 575.1, the subject matter of which is incorporated herein by reference.

The description with the aid of the examples is not limiting. Rather, this disclosure comprises any new feature and any combination of features, which in particular includes any combination of features in the appended claims, even if the feature or combination is not itself explicitly stated in the claims or examples.

The invention claimed is:

1. An optoelectronic semiconductor component comprising:
   a semiconductor body that generates and/or receives radiation;
   a radiation passage surface;
   at least one connecting surface arranged on a side of the semiconductor body facing away from the radiation passage surface;
   a molded body arranged on the side of the semiconductor body facing away from the radiation passage surface and borders the semiconductor body and the connecting surface; and
   a further molded body that forms a lateral surface of the semiconductor component delimiting the semiconductor component in a lateral direction running parallel to the radiation passage surface and borders the molded body and the semiconductor body in some areas.

2. The optoelectronic semiconductor component according to claim 1, made by a method comprising:
   a) preparing a composite with a semiconductor layer sequence, wherein the composite comprises a plurality of component areas mechanically connected to one another;
   b) forming a plurality of connecting surfaces on the semiconductor layer sequence, wherein at least one connecting surface is formed on each component area;
   c) forming a molding compound on the semiconductor layer sequence, wherein the molding compound fills interstices between the connecting surfaces; and
   d) singulating the composite with the molding compound, wherein during singulation a plurality of molded bodies is formed from the molding compound, each of which is associated with a semiconductor body obtained from a component area of the composite.

3. The optoelectronic semiconductor component according to claim 2, wherein a growth substrate for the semiconductor layer sequence is removed after c).

4. The optoelectronic semiconductor component according to claim 3, wherein contacts are formed on the further composite, each of which electrically connects to one of the connecting surfaces.

5. The optoelectronic semiconductor component according to claim 3, wherein the molding compound and the further molding compound are applied in a molding method.

6. The optoelectronic semiconductor component according to claim 2, wherein the semiconductor bodies and the molded bodies are overmolded with a further molding compound after d) to form a further composite, the further molding compound is formed such that the connecting surfaces are completely covered, and the connecting surfaces are exposed in a further step before the further composite is severed.

7. The optoelectronic semiconductor component according to claim 6, wherein, between d) and formation of the further composite, a center-to-center distance between adjacent semiconductor bodies is increased.

8. The optoelectronic semiconductor component according to claim 6, wherein the further molding compound is severed to form the semiconductor components from the further composite.

9. The optoelectronic semiconductor component according to claim 6, wherein, when exposing the connecting surfaces, the molding compound and the further molding compound are removed in some areas.

10. The optoelectronic semiconductor component according to claim 6, wherein the molding compound is formed such that the connecting surfaces are completely covered, and the connecting surfaces are exposed before the further molding compound is applied.

11. The optoelectronic semiconductor component according to claim 2, wherein singulation of the composite takes place by coherent radiation.

12. The optoelectronic semiconductor component according to claim 1, wherein the molded body and the further molded body in some areas form a reverse side facing away from a radiation passage surface.

13. The optoelectronic semiconductor component according to claim 1, wherein, at least along a lateral direction, an extension of the molded body is no more than 20 μm greater than an extension of the semiconductor body.

14. The optoelectronic semiconductor component according to claim 1, wherein the molded body and the further molded body are opaque to the radiation generated or to be received in the semiconductor body during operation.

15. The optoelectronic semiconductor component according to claim 1, wherein the semiconductor component has a contact on a reverse side of the further molded body facing away from the radiation passage surface, which contact electrically connects to the connecting surface, and the contact overlaps the molded body and the further molded body in a top view of the semiconductor component.

16. The optoelectronic semiconductor component according to claim 1, wherein an electronic component is embedded in the further molded body.

17. The optoelectronic semiconductor component according to claim 1, made by a method comprising:
   a) preparing a composite with a semiconductor layer sequence, wherein the composite comprises a plurality of component areas mechanically connected to one another;
   b) forming a plurality of connecting surfaces on the semiconductor layer sequence, wherein at least one connecting surface is formed on each component area;
   c) forming a molding compound on the semiconductor layer sequence, wherein the molding compound fills interstices between the connecting surfaces;
   d) singulating the composite with the molding compound, wherein, during singulation, a plurality of molded bodies is formed from the molding compound, each of which is associated with a semiconductor body obtained from a component area of the composite;
   e) overmolding the semiconductor bodies and the molded bodies with a further molding compound after d) to form a further composite, wherein the further molding compound is foamed such that the connecting surfaces are completely covered;
   f) exposing the connecting surfaces; and
   g) severing the further composite.

18. The optoelectronic semiconductor component according to claim 17, wherein, when exposing the connecting surfaces in f), the molding compound and the further molding compound are removed in some areas.

\* \* \* \* \*

UNITED STATES PATENT AND TRADEMARK OFFICE
CERTIFICATE OF CORRECTION

| | | |
|---|---|---|
| PATENT NO. | : 10,361,345 B2 | Page 1 of 1 |
| APPLICATION NO. | : 15/542150 | |
| DATED | : July 23, 2019 | |
| INVENTOR(S) | : Hoppel | |

It is certified that error appears in the above-identified patent and that said Letters Patent is hereby corrected as shown below:

In the Claims

At Column 14, at Line 26, please change "foamed" to --formed--.

Signed and Sealed this
First Day of October, 2019

Andrei Iancu
*Director of the United States Patent and Trademark Office*